United States Patent [19]

Hickin et al.

[11] 3,984,827

[45] Oct. 5, 1976

[54] BEAM REPOSITIONING CIRCUITRY FOR A CATHODE RAY TUBE CALLIGRAPHIC DISPLAY SYSTEM

[75] Inventors: Charles Wyndham Robinson Hickin; Theodore John Scarpino, both of Binghamton, N.Y.

[73] Assignee: General Electric Company, Binghamton, N.Y.

[22] Filed: Sept. 19, 1974

[21] Appl. No.: 507,439

[52] U.S. Cl. .............................. 340/324 A; 235/198
[51] Int. Cl.[2] ...................... G06F 3/14; G06K 15/18
[58] Field of Search ..... 340/324 A, 324 AD, 324 R; 235/198

[56] References Cited
UNITED STATES PATENTS

| | | | |
|---|---|---|---|
| 3,540,032 | 11/1970 | Criscimagna et al. | 340/324 A |
| 3,836,903 | 9/1974 | Lawrence | 340/324 R |
| 3,869,085 | 3/1975 | Green | 340/324 A |
| 3,889,244 | 6/1975 | Sinobad | 340/324 A |

*Primary Examiner*—Marshall M. Curtis
*Attorney, Agent, or Firm*—I. D. Blumenfeld

[57] ABSTRACT

A beam repositioning system for a calligraphic display system is described in which beam repositioning time is minimized. When the beam repositioning signal is applied to the deflection circuits of the CRT, the deflection signal, either yoke current or deflection voltage, is sensed and a "beam slewing" logic signal is generated as long as the deflection signal is changing indicating that the beam is being repositioned. This logic signal activates a control circuit which generates a "hold" signal for the symbol generating or "stroke" circuits which persists as long as the logic signal remains at the logic "one" level. When the beam is repositioned as indicated by the fact the deflection signal no longer changes, a logic "zero" signal is generated which actuates a first timing circuit which generates a first control signal if the logic signal remains at the zero level for a first predetermined period. This initial period is to allow beam settling and to avoid preturbations due to beam overshoot or undershoot. The first control signal blocks the beam slewing logic signal so that the changes in deflection signals due to generation of the actual symbols have no effect on the beam repositioning circuits. After a further period of time, a second control signal is generated which enables the symbol writing or stroking circuits of the cathode ray tube device to permit the symbols to be generated and displayed. In this fashion, the blanking of the signal beam and the repositioning of the beam is closely and accurately controlled to reposition the beam in the minimum time possible.

7 Claims, 7 Drawing Figures

BEAM REPOSITIONING CIRCUITRY FOR A CATHODE RAY TUBE CALLIGRAPHIC DISPLAY SYSTEM

The instant invention relates to a calligraphic display system, and more particularly, to a display system in which beam repositioning time between symbol generation is minimized.

In cathode ray tube calligraphic, or stroke display systems, it is necessary to position the cathode ray tube beam to the point on the tube face where the next symbol is to be generated. The beam is blanked while doing this to prevent visible streaking on the display. The time required to position the cathode ray beam for each symbol is variable. This variation in the repositioning time depends upon the position where the last symbol was displayed relative to the position of the next symbol as well as the characteristics of the deflection circuitry, namely, the band width of the deflection amplifiers. In the past, it has been customary to allot a fixed time for repositioning of the beam. The fixed time was the time required for the maximum repositioning of the beam. In other words, the fixed time was assessed on a "worst case" basis. Obviously, where the required repositioning distance is small, the alloted fixed, repositioning time was substantially in excess of the time actually required to reposition the beam. This obviously represents an inefficient utilization of the system since it is desirable to minimize the time required for beam repositioning in order to maximize the capacity of the display system in terms of symbol density. Furthermore, since the maximum required beam repositioning time for the worst case is normally large with respect to the actual time required to display a given symbol (it is not unusual to have a maximum repositioning time of 25 to 30 microseconds versus an 8–10 microseconds symbol stroking time), the use of fixed repositioning time based on a worst case repositioning is extremely wasteful and inefficient.

It would therefore be highly desirable to provide a calligraphic cathode ray display system in which the beam repositioning time is variable and is automatically adjusted by determining when the beam has repositioned itself to a new point and the display is ready to project a new symbol. In this fashion, the beam repositioning time is minimized as a function of the actual repositioning required for a given symbol display.

It is therefore a primary objective of the invention to provide a cathode ray tube symbol display system in which the time required to reposition the beam between symbols is minimized.

Yet another objective of the invention is to provide a cathode ray tube display system in which the beam repositioning time is minimized and the amount of symbology the system is capable of displaying is maximized.

Still another objective of the invention is to provide a cathode ray tube display system in which it is automatically determined when the beam has repositioned itself to a new point and beam repositioning time and blanking is thereafter terminated.

Other objectives and advantages of the instant invention will become apparent as the description proceeds.

The various objectives and advantages of the instant invention are realized in a cathode ray tube display system in which a logic signal is derived from the X and Y deflection circuits of the cathode ray tube display unit to determine when the beam is being deflected (or is slewing) in response to a repositioning signal. When the position data signal is first initiated to begin repositioning of the beam prior to the generation of the next symbol, the deflection or stroking circuits for producing the symbols are disabled. The logic signal from the deflection circuits which indicates beam repositioning or slewing is applied to a Slew Complete circuit which mantains the symbol stroking circuits disabled as long as the logic signal remains at a logic one level which indicates that the beam is still being repositioned, i.e., is still slewing. Whenever the logic signal from the deflection circuits drops to the logic zero level which indicates the beam repositioning signals are no longer varying, a counter controlled timing circuit is initiated which unblanks the symbol stroke circuits if the logic signal remains at the zero level for a sufficient time to indicate that the beam is no longer moving. The time period is chosen to allow final beam settling to avoid preturbations due to beam overshoot and undershoot. The display circuit is thus enabled at the end of beam repositioning to allow a new symbol to be displayed. Simultaneously, a disable signal is applied to the Slew Complete circuits to block the beam slewing logic signals to prevent changes in the beam position during symbol stroking from affecting the operation of the display system.

The novel features which are characteristic of this invention are set forth with particularity in the appended claims. The invention itself, however, both as to its organization and method of operation, together with other objectives and advantages, may best be understood by reference to the following description taken in connection with the accompanying drawings in which:

Figure 1:
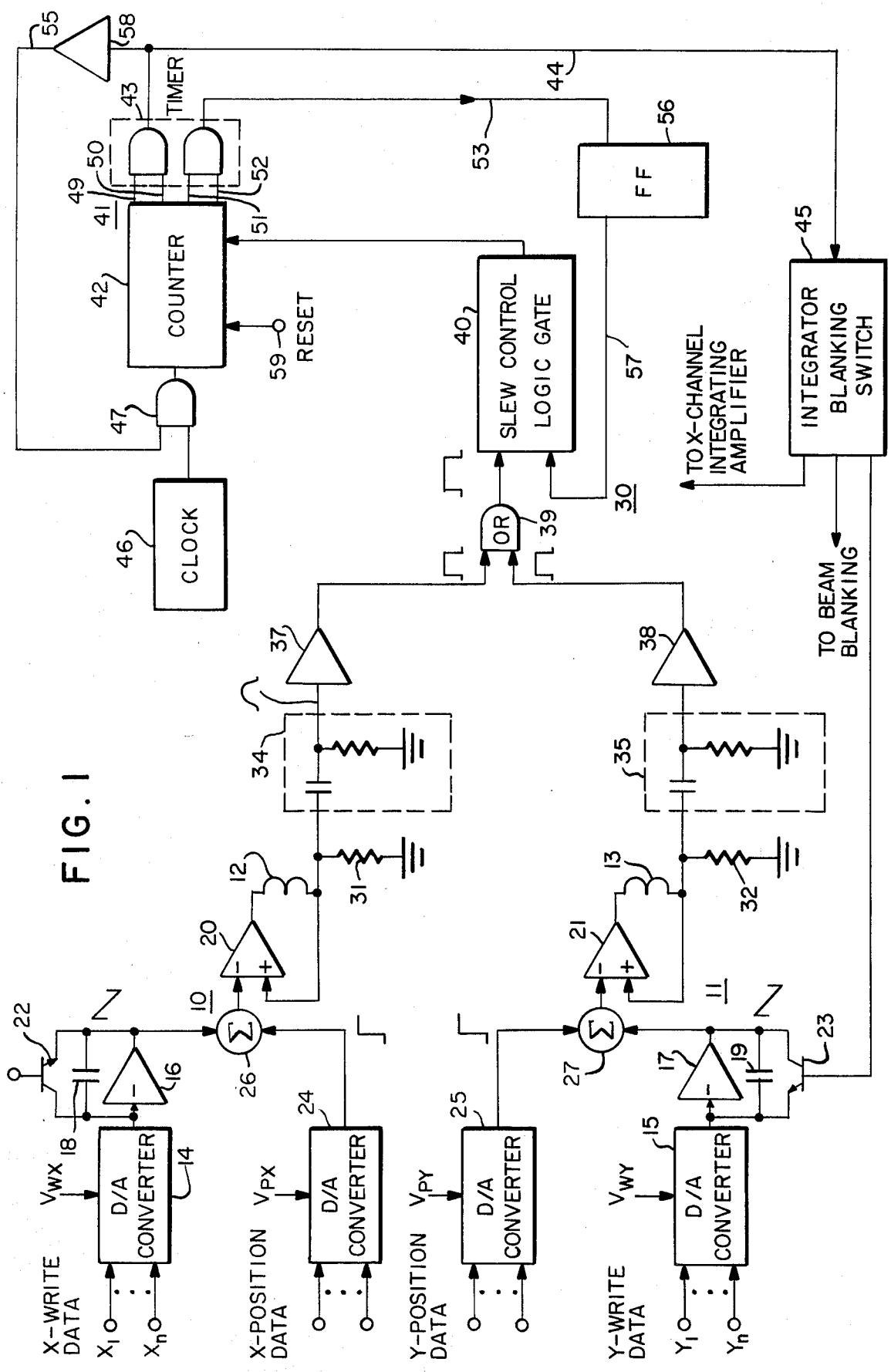
FIG. 1 shows the beam repositioning circuit of the instant invention in block diagram form.

FIG. 1 illustrates in block diagram form a cathode ray tube calligraphic display system in which beam repositioning time is minimized by automatically sensing when the beam has been repositioned to the new point to terminate blanking of the beam. Electrical signals in the form of a plurality of parallel, digitally coded signals representing the desired deflection/write rates for stroking the symbol to be generated are applied over X and Y deflection voltage generating paths 10 and 11. The digitally coded signals representing the desired X and Y deflection/write rates are converted to suitable ramp or deflection voltages which are applied to the deflection system of the cathode ray tube, not shown. In FIG. 1, the CRT deflection system is shown as including electromagnetic yokes 12 and 13. The parallel digital signals representing the X and Y deflections/write rates which are applied to inputs $X_1$–$X_n$ may be obtained from any suitable source such as a symbol generator where a symbol may be stored in a memory and selectively called out for display. This information in digital form represents a value of beam deflection rate or "write" rate necessary to generate a particular line segment of the symbol or other representation which is to be displayed on the cathode ray tube. This parallel, digital information is applied in each of the X and Y paths to digital to analog converters 14 and 15 along with the reference voltages $V_{WX}$ and $V_{WY}$. The D/A converters may be of the ladder and switch type in which a plurality of switches and binary weighted resistance ladders are included to convert the digital information to an analog output voltage which is proportional to the input deflection/write rate as defined by the digital code. The output current of the digital to analog converter is proportional to the input deflection/write rate, the internal resistance of the ladder network and the reference voltage applied to the converter. The output currents from the respective converters 14 and 15 are therefore defined by $$I_X = \frac{V_{WX}}{R_i} K_{WX} \quad (1)$$

$$I_Y = \frac{V_{WY}}{R_i} K_{WY} \quad (2)$$

where $V_{WX}$ is the reference voltage applied to D/A converter 14, $V_{WY}$ is the reference voltage applied to D/A converter 15, $K_{WX}$ is the X deflection/write rate in digital form, and $K_{WY}$ is the Y deflection/write rate in digital form. The output currents from the two digital to analog converters are applied to the inverting inputs of a pair of integrating amplifiers 16 and 17 which generate ramp or sawtooth voltages with slope proportional to the input deflection/write rates $K_{WX}$ and $K_{WY}$. That is, by virtue of the integrating action of the amplifiers, the output from amplifiers 14 and 15 are respectively $$V_{OX} = \frac{V_{WX} \cdot t}{\tau} K_{WX} \quad (3)$$

in the case of amplifier 16 and:

$$V_{OY} = \frac{V_{WY} \cdot t}{\tau} K_{WY} \quad (4)$$

in the case of amplifier 17. Thus, it can be seen that the output voltages are proportional respectively to the X and Y deflection/write rates. The slopes of these voltages, i.e., $V_{OX}/t$ and $V_{OY}/t$ are respectively:

$$\frac{V_{OX}}{t} = V_{WY} \cdot \frac{K_{WY}}{\tau} \text{ and } \frac{V_{OY}}{t} = V_{WY} \cdot K_{WY} \quad (5)$$

where $\tau \times$ the R-C time constant of the internal resistance of the digital to analog converter and integrating capacitors 18 and 19 in the feedback paths of the integrating amplifiers. It can be seen therefore, that the output voltages from amplifiers 16 and 17 may be applied through suitable deflection amplifiers 20 and 21 to yokes 12 and 13 of the cathode ray tubes to stroke the symbols.

Positioned across integrating capacitors 19 and 18 of the integrating amplifiers are blanking or disabling switches in the form PNP amplifiers 22 and 23 which are controlled from the beam repositioning network, presently to be described, to disable the integrating amplifiers during beam repositioning intervals and prevent symbol stroking information from being fed to the display device. Thus, during the repositioning periods a negative voltage is applied to the base of these transistors driving them into conduction and the collector-emitter paths of these transistors effectively short the integrating capacitors disabling the integrating amplifiers. After the repositioning period is terminated, the blanking voltages for transistor switches 22 and 23 are removed. This drives the switches into the non-conducting state, removing the short circuit across the integrating capacitors and permitting the integrating amplifiers to produce the ramp voltages for the cathode ray tube to stroke the line segments making up the symbol.

The deflection voltages applied to the cathode ray tube include X and Y position data which positions the CRT beam spatially in order to display the individual symbols at the proper location. To this end, X position and Y position data in the form of a parallel, digitally coded position information is applied to the inputs of position digital to analog converters 24 and 25 to produce an analog beam position signal. The analog beam position signals are applied to summing nodes 26 and 27 where the X and Y position data is combined with the X and Y deflection/write data from integrating amplifiers 16 and 17. These two signals are summed in the nodes 26 and 27 and applied to deflection amplifiers 20 and 21 so that the signal applied to the deflection yokes is the sum of the position signal indicating the point at which the symbol is to be displayed, as well as information to cause the beam to be deflected to generate or stroke the symbol.

Coupled to the deflection circuitry of the cathode ray tube is a logic network 30 which senses when the beam is changing position or slewing and generates logic signals to blank the beam during repositioning but also to disable the integrating amplifiers in the X and Y write channels to prevent the ramp voltages generated in these channels from affecting the repositioning of the beam. The network continues to blank the beam and maintain the integrating amplifiers in a disabled state as long as the deflection amplifier circuits in the X and Y channels are producing repositioning or beam slewing signals. As soon as the beam has been positioned and the deflection signals to the cathode ray tube are no longer changing, the logic signal changes and the logic circuitry is then actuated into its timing phase. Thus, if the state of the deflecting circuts, as indicated by the logic signal, shows that the beam is no longer slewing and has reached the desired position and has remained in that position for a predetermined time, i.e., beam overshoot or undershoot due to damping problems are no longer present, then further control signals are generated which enable the integrating amplifiers and unblank the electron beam so that the system generates the desired symbol. When the next symbol is to be generated and new position data is entered to reposition the beam, a reset signal is transmitted to the logic circuitry to reset it. This again blanks the beam and disables the integrating amplifiers in the X and Y deflection/write paths.

The beam repositioning logic network shown generally at 30 senses the change in the CRT deflection signals to generate a logic signal indicating that the beam is being repositioned, i.e., is slewing. In the arrangement shown in FIG. 1, the current flowing through the CRT X and Y deflection yokes produces a voltage across the sensing resistors 31 and 32 which is proportional to the yoke current. Since the symbol position change signal is in the form of voltage step, the deflection amplifiers 20 and 21 respond by rapidly changing or slewing the yoke current in order to reposition as a function of the position voltage. The voltage developed across the resistors 31 and 32, which also are applied as feedback voltage to the deflection amplifier, is therefore, proportional to the rate at which the yoke current is changing. This voltage is applied to a pair of R-C differentiating networks 34 and 35 to produce an output voltage which is proportional to the rate of change of voltage, and hence, to the rate of change of yoke current. The output of the differentiating networks are pulses which have a duration equal to the time that the voltage, and hence the current, is changing, i.e., as long as the yoke current is slewing and the beam is being repositioned. The output of the differentiating network goes to zero when the yoke currents reach a steady state value.

The outputs from dfferentiating networks 34 and 35 are applied to a pair of switching amplifiers 37 and 38 which convert the output pulses to a rectangular wave form. That is, the switching amplifiers have very high forward gains and switch at very low threshold values of input voltage. As a result, the amplifiers switch almost instantaneously so that a substantially rectangular wave form is generated at the output of these amplifiers in response to the pulses from the differentiating networks. The rectangular output wave forms from amplifiers 37 and 38 are applied to an OR gate 39 which acts as a logic element so that if either the X or Y deflection currents are slewing indicating a repositioning of the beam, the output of OR gate 39 is a high or logic one signal.

This logic signal is utilized to control the remaining logic network to maintain the integrating amplifiers in the deflection/write paths disabled and to blank the electron beam as long as the beam is being repositioned; and only when the yoke current slewing is terminated, is the beam unblanked and the amplifiers enabled. To this end, the logic signal from OR gate 39 is applied to a Slew Control Logic gate 40 which in turn, controls a Counter Timer Network shown generally at 41. When the logic signal from OR gate 39 is at the logic one level the output from Slew Control Logic gate 40 holds counter 42 in Counter-Timer 41 in the zero or non-counting state. With counter 42 held at zero, the output from timer 43 which is coupled to counter 42, is a blanking signal which is applied over lead 44 to integrator and beam blanking switch 45. One output from switch 45 is a pair of disabling signals to transistor switches 22 and 23 associated with integrating amplifiers 16 and 17. Thus, whenever the logic one signal is generated in response to the deflection indicating that the beam is being repositioned, integrating amplifiers in the X and Y deflection/write paths are disabled and the electron beam of the cathode ray tube is blanked.

Counter 42 is of standard construction and has pulses from a clock 46 coupled thereto through a suitable gate 47. The other input to gate 47 is from one output of timer 43 which, as will be explained in detail later, will stop passage of the clock pulses through the gate and inhibit the counter from further counting whenever the logic circuitry has sensed that the beam has been repositioned and is no longer moving. Counter 42 consists of a series of flip-flops, to count the clock pulses and produce an output at leads 49–52 which is proportional to the count. The count, in turn, represents a time period. Leads 49–52 are coupled to logic gates forming part of timer 43. When the logic signal from OR gate 39 drops from the logic one to the logic zero level indicating the yoke current is no longer slewing, the signal from logic gate 40 which holds counter 42 at zero count ceases. Counter 42 begins to count. If the logic level remains at zero and counter 42 reaches a first predetermined count, a signal on lead 53 from timer 43 will set the flip-flop 56. The signal on lead 57, from flip-flop 56 inhibits logic gate 40 and prevents slew logic signals from OR gate 39 from resetting or holding counter 42 from counting. Counter 42 will then reach a second predetermined count representing a time sufficient to permit the beam to settle at the desired position. Timer 43 will pass a signal over lead 55 to converter 58 inhibiting gate 47. This prevents clock pulses from clock 46 from reaching counter 42. Counter 42 stops at this count and is in a locked-up state. Simultaneously, a signal on lead 44 to the integrator blanking switch 45 removes the beam blanking signal to the cathode ray tube and removes to disable signals to transistor switches 22 and 23 allowing the commencement of symbol stroking. When the yoke current reaches the desired level to position the beam at the desired point, the yoke current will often oscillate, i.e., overshoot or undershoot snce an inductive device which may not be critically damped is involved. In so oscillating the current goes to zero and then reverses. Differentiating circuits 34 and 35 produce an output so that OR gate 39 drops from the logic one to the logic zero level, but goes back to the logic one level as the current oscillates and dies down. Hence, a predetermined time period to allow for settling time of the yoke current and the beam is necessary. If, however, the logic signal remains at the logic zero level for the predetermined period of time, (2 microseconds, for example) indicating that the beam has settled, then a control signal is produced by timer 43 which is applied to Slew Control Logic gate 40 through flip-flop 56 to disable the gates and block signals from the deflection circuits from reactivating the logic network. Flip-flop 56 is necessary in the event that predetermined period of time has expired or counter 42 has reached a predetermind state. This is necessary to prevent changes in yoke current due to deflection of the beam in response to the symbol being generated from affecting the logic network. Consequently, at the end of the first time period, the gate connected to counter leads 51 and 52 produces an output signal which is coupled over lead 53 through flip-flop 56 to the input of logic gate 40 to disable the gate and prevent any further logic signals from being transmitted to counter 42. If, on the other hand, the output of OR gate has gone back to the logic one level within the predetermined time period, the logic one level signal is transmitted to logic gate 40 and resets the counter back to the zero count. This continues until the beam has been repositioned and the output of OR gate 39 remains at the logic zero level for the predetermined period of time. Thereafter, a second predetermined time period of very short duration is counted by counter 42 and actuates the second gate in timer 43 to generate a control signal which is applied over lead 44 to integrator blanking switch 45 to disable integrating amplifier switches 22 and 23. This enables the amplifiers to generate the symbol write or stroke voltages to display the next symbol. The control voltage is also applied over lead 55 to AND gate 47 to block the gate and prevent further clock pulses from being applied to counter 42. With the counter locked at the predetermined count, the output of the timer network 43 maintains slew control logic gate 40 and integrator blanking switch 45 disabled. The logic network which senses beam positioning is thus locked out and the display system operates in its normal manner to generate and display the desired symbols. At the end of the particular symbol display period when the next symbol has to be displayed, a position voltage is again applied to D/A converters 24 and 25. Simultaneously, a reset pulse is applied at input terminal 59 of counter 42 which resets flip-flop 56 and the counter to zero count. When the counter goes to zero count, the output of timer 43 changes and the disabling signals applied over leads 44, 53 and 55 to slew control logic gate 40 through flip-flop 56 to integrator blanking switch 45 and clock AND gate 47, respectively are removed. As a result, Slew Control Logic gate 40 will again pass the logic signal indicating beam repositioning. Integrator blanking switch 45 is actuated to disable the integrating amplifiers in paths 10 and 11 and the CRT beam is blanked to prevent a visible streaking on the face of the tube during repositioning. The same sequence of events then takes place with the counter being maintained in the zero count state as long as the logic signal from the circuits coupled to the yoke is at the logic one level indicating that the current is changing rapidly and the beam is being repositioned. After the beam is positioned and the current is no longer changing so that the signal goes to a logic zero level, the counter is actuated to a count for a predetermined period of time to assure that over/undershoot of the beam will not actuate symbol generation and that the beam has settled. The blanking time for the repositioning of the beam is thus varied depending on the distance the beam has to move. The repositioning yoke current is sensed and used to control the duration of beam blanking only as long as this current is still changing and the beam is still moving. As soon as the yoke current stops changing and remains that way, the repositioning period is terminated and normal symbol display begins. This, of course, results in minimizing the time allocated and used for beam repositioning and maximizes the amount of symbology the system can display.

Referring now to FIGS. 2a through 2f, various wave form diagrams are shown therein which are useful in understanding the manner in which the invention functions. Thus, in FIG. 2a, the position change voltage and the yoke current for one of the deflection channels are plotted with the voltage and current being plotted along the ordinate and time along the abscissa. Thus at time $t_0$, the position data voltage 60 is changed in the positive direction from previous value $V_A$ to a new value $V_B$. The change in the position data voltage is, as may be seen, a step function going virtually instantaneously at $t_0$ from $V_A$ to $V_B$. However, since current must be driven through an inductor, namely the yoke, the current level cannot change instantaneously and a finite period of time is required to bring the current level in the yoke up to the desired level for the new position. Thus, the current in the yoke (which may for example be the X yoke 12) is shown by curve 61 with the slope of this curve being a function both of the applied voltage and the inductance of the yoke. As the current through yoke 12 changes rapidly from the value $t_0$ to the value at $t_2$, the voltage across the sensing resistor changes rapidly and the output of differentiating network 34 is illustrated by the curve 62 in FIG. 2b. Thus, at $t_0$ when yoke current begins to change, a pulse is generated at the output of differentiating network. At time $t_2$, the current reaches a constant value, at which time, the output pulse from differentiating network also goes to zero. If the system is critically damped or overdamped and the current reaches the desired level smoothly, there will be no overshoot or undershoot of the yoke current. However, if the system is not properly damped, the current will not reach the desired level smoothly and there will be one or more oscillations shown by the damped oscillations 63 and 64 in the differentiating network after main puse 62 goes to zero.

Figure 2:
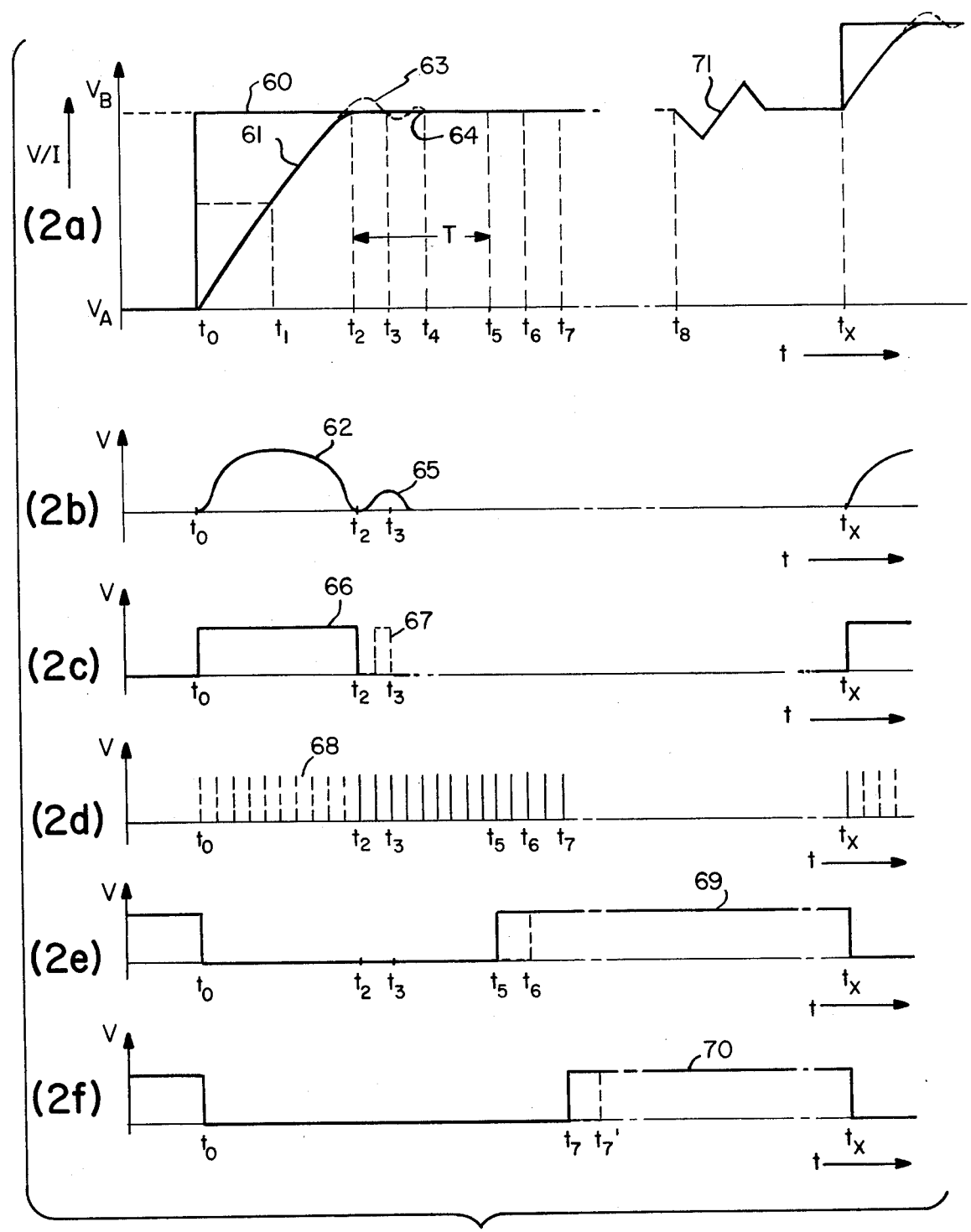
FIGS. 2a–2f show the wave forms in various portions of the circuit and are useful in understanding the operation of the system.

If the current in the X yoke goes smoothly to the desired value, the output of the switching amplifier 37 coupled between OR gate 39 and differentiator 34 is a rectangular wave which as shown in FIG. 2c goes positive at $t_0$ and goes negative at $t_2$. If, however, the yoke is not critically damped, the current will first overshoot and then undershoot a number of times producing current oscillations 63 and 64. These oscillations produce another logic one pulse 67 at the output of the switching amplifier at time $t_3$. The primary rectangular pulse 66 from switching amplifier 37 is applied to the OR gate 39 and produces a corresponding positive output pulse which is applied through the Slew Control Logic gates 40 to counter 42 to inhibit that counter and maintain it at a zero count. Thus, as long as the output of OR gate 39 is at the logic one level as represented by pulse 66 in FIG. 2c, the clock pulses 68 shown in FIG. 2d by means of the dashed pulses do not affect the counter since it is inhibited from counting by the control signal from logic gates 40. At $t_2$, however, when the output of the differentiator goes to zero and the output of switching amplifier 37 and OR gate 39 go to the logic zero level, the inhibiting signal to counter 42 is removed and it begins to count. During the interval from $t_0$ to $t_2$ when counter 42 is held at zero count, the output from timer 43 logic gates, illustrated by curves 69 and 70 of FIGS. 2e and 2f, is at a low level thereby actuating integrator blanking switch 45 and AND gate 47 associated with clock 46. During this interval integrator blanking switch 45 applies a negative output control voltage to the bases of the switching transistors 22 and 23 associated with integrating amplifiers 16 and 17 driving these transistors into conduction and short circuiting the integrating capacitors and disabling the integrating amplifiers. Similarly, the output to the CRT control grids is of such a polarity and magnitude as to blank the electron beam.

If there is no overshoot or undershoot, counter 43 goes through a first predetermined count which establishes the beam positioning period and at $t_5$, the output at leads 51 and 52 go positive enabling its associated gate and producing an inhibiting signal which is applied over lead 53 through flip-flop 56 to Slew Control Logic gates 40. The inhibiting signal disables gate 40 and prevents any further logic signals from OR gate 39 to block counter 42. That is, the output of OR gate 39 has remained at the logic zero level for a predetermined period of time, logic gates 40 are shut down, the counter is permitted to count up to the predetermined level and then the logic signal is locked out.

If the beam has not settled, on the other hand, and there has been overshoot such as shown by the dashed curve 63 and 64, a further pulse 65 is produced at the output of the differentiator at $t_3$, pulse 65 drives switching amplifier 37 and OR gate 39 positive producing another rectangular logic one pulse 67. Positive pulse 67 is applied through Slew Control Logic gates 40 to counter 42 and resets counter 42 at the zero count. When the current settles to a fixed level, pulse 67 goes to zero again and the counter begins counting. Not until $t_6$ is the output from the counter such that the slew control logic gates are disabled thereby locking out the logic signal from the CRT deflection circuit.

At $t_7$, if there have been no current oscillations, counter 42 has reached a second count defining an additional time period after beam settling, and the outputs at leads 49 and 50 of the timer is such that the output from the second time logic gate goes positive. This signal is applied over leads 55 and 44 to clock gate 47 and integrator blanking switch 45. The second control signal disables gate 47 terminating transmission of the clock pulses to counter 43 holding the counter at the given count and maintaining the output of the timer at the desired state. Switch 45 is disabled by the second control signal removing the negative voltages from the bases of transistor switches 22 and 23. The switches are driven into the non-conducting state removing the short circuit from capacitors 18 and 19 of the integrating amplifiers allowing these amplifiers to function in their normal mode to generate the ramp voltages for stroking the line segments of the symbols to be displayed. Simultaneously, the blanking voltage for the CRT grid is removed terminating blanking of the beam and the system is now ready to generate the desired symbol at the given location. At $t_8$, therefore, the deflection voltages from the X and Y write deflection voltage generating paths 10 and 11 produce suitable voltages to produce the desired symbol deflections shown generally at 71 of FIG. 2a, thereby generating the desired line segments and ultimately, the symbol to be displayed on the CRT. At $t_x$, a new position signal is applied to D/A converters 23 and 24 in the X and Y position data paths. Simultaneously, a reset signal to reset terminal 59 of counter 42 and flip-flop 56, resetting the counter to the zero count and resets the flip-flop. When the counter 42 is reset to zero, the outputs of timer 43 go down. Gate 47 is enabled and clock pulses can now again be applied to the counter. Simultaneously, the disabling signal applied to flip-flop 56 over lead 53 is removed and flip-flop remains in reset state. However, the logic signal from OR gate 39 which has again gone to the logic one level maintains the counter at the zero count. Simultaneously, the disabling voltage is applied over lead 44 to integrator blanking switch 45 and a negative voltage is reapplied to the bases of transistors 22 and 23 along with a beam blanking voltage to the grid of the CRT. The beam is therefore blanked, and the transistor switches short circuit integrating capacitors 18 and 19 thereby terminating the generation of the ramp voltages for stroking the symbol line segments. Repositioning of the beam then continues until the beam is positioned at the new location and the logic network once again senses that the beam has settled.

It can be seen therefore that the beam repositioning system of the instant invention provides for repositioning of the beam in response to a position control signal, blanks the beam and disables the writing circuits during repositioning, but terminates blanking and disabling of the writing circuits whenever the beam has been repositioned and remains stationary. In this fashion, the beam repositioning time is of varied duration depending on the amount of movement of the beam necessary in order to position it at the next location where a symbol is to be generated. The system thus is highly efficient in that the beam repositioning blanking time is minimized and the amount of symbology system can display is maximized.

While a particular embodiment of this invention has been shown and described above, it will, of course, be understood that the invention is not limited thereto since many modifications thereof may be made. It is contemplated by the appended claims to cover any such modifications which fall within the true spirit and scope of this invention.

What is claimed as new and desired to be secured by Letters Patent of the United States is:

1. In a Beam repositioning Network for a Cathode Ray Tube Display System the combination comprising,
   a. means responsive to digitally coded signals representing X and Y coordinates of selected beam write rates to produce beam deflection signals for generating the desired displays,
   b. means responsive to digitally coded beam position signals to produce beam positioning deflection signals to position the beam in a desired location before generating the displays,
   c. means for blanking the beam while the beam deflection signals are varying or slewing during positioning including,
      1. means for sensing the beam deflection signals to produce a control signal as long as the deflection signal varies indicating that beam is still moving,
      2. a timing and enabling signal generating network coupled to said beam blanking means to enable said blanking means at the initiation of beam positioning,
      3. control signal gating means coupled between said sensing means and said timing and enabling means to disable said timing means for the duration of the control signal from said sensing means to maintain the beam blanked as long as the beam is moving during repositioning, said timing means being actuated to disable the blanking means a predetermined time after termination of the control signal and movement of the beam to unblank the beam after it has reached the desired location and settled to minimize beam repositioning blanking time.

2. The Beam Repositioning Network according to claim 1 wherein the means for sensing the deflection signals and producing said control signal includes differentiating circuit means coupled to the beam deflecting circuits to produce an output pulse as long as the deflection signals vary and logic means to produce a control signal for the duration of the output pulse from the differentiating means.

3. The Beam Repositioning Network according to claim 2 in which said logic means comprises an OR circuit.

4. The Beam Repositioning Network according to claim 2 wherein said Timing and Enabling Network includes a counter which is disabled by the control signal applied through said gating means, said timing network initiating an interval count after said control signal is terminated to disable said beam blanking means a predetermined time after termination of the control signal to unblank the beam after it has reached the desired location thereby to minimize beam repositioning blanking time.

5. The Beam Repositioning Network according to claim 4 wherein said counter includes a source of clock pulses, a shift register, a clock pulse gate coupled between said source and said counter, means to apply said control signal to said counter to maintain it disabled so that the counter initiates counting only after said control signal is terminated, means coupled to the output of said shift register and responsive to a predetermined count after termination of said control signal to disable said beam blanking means a predetermined time after termination of said control signal.

6. The Beam Repositioning Network according to claim 5 including means coupled to said gate to disable said clock pulse gate after said predetermined count to hold said counter at said predetermined count.

7. The Beam Respositioning System according to claim 5 in which said means responsive to the predetermined count from said shift register includes first timer gating means which produces an output after a first predetermined count, means coupling the output of said first timer gating means to the control signal gating means to disable said gating means and prevent transmission of the output pulse from said differentiating means through said gate to reset the counter to zero, a second timer gating means for producing an output after a second predetermined count, means coupling the output from said second gating means to said beam blanking means to disable the beam blanking means and unblank the beam, and means coupling the output from said second gating means to the clock pulse gate to block the gate and hold the counter at the second predetermined count until the appearance of a subsequent digitally coded beam position signal.

* * * * *